US008253598B2

(12) United States Patent
Ho

(10) Patent No.: US 8,253,598 B2
(45) Date of Patent: Aug. 28, 2012

(54) LIGHT-EMITTING KEYBOARD

(75) Inventor: Shin-Cheng Ho, Taipei County (TW)

(73) Assignee: Darfon Electronics Corp., Taoyuan (TW)

( * ) Notice: Subject to any disclaimer, the term of this patent is extended or adjusted under 35 U.S.C. 154(b) by 458 days.

(21) Appl. No.: 12/651,743

(22) Filed: Jan. 4, 2010

(65) Prior Publication Data

US 2010/0176974 A1 Jul. 15, 2010

(30) Foreign Application Priority Data

Jan. 9, 2009 (TW) ............................... 98200315 U

(51) Int. Cl.
*H03K 17/94* (2006.01)

(52) U.S. Cl. .......... 341/22; 345/168; 345/170; 200/310; 200/314; 400/472; 400/489; 362/253; 362/623; 362/617; 362/634; 349/61; 349/58; 349/149; 349/150

(58) Field of Classification Search .................... 341/22; 400/472, 489; 200/310–314; 345/168, 170; 349/58–65, 149–151; 362/612–634
See application file for complete search history.

(56) References Cited

U.S. PATENT DOCUMENTS

| | | | | |
|---|---|---|---|---|
| 4,491,692 | A * | 1/1985 | Lee | 362/24 |
| 6,648,530 | B2 * | 11/2003 | Kamei et al. | 400/472 |
| 6,803,903 | B1 * | 10/2004 | Ostergård et al. | 345/168 |
| 7,641,378 | B2 * | 1/2010 | Chuang et al. | 362/633 |
| 7,709,760 | B2 * | 5/2010 | Chen et al. | 200/314 |
| 8,021,034 | B2 * | 9/2011 | Lee et al. | 362/633 |
| 8,189,135 | B2 * | 5/2012 | Bae et al. | 349/61 |
| 2009/0040075 | A1 * | 2/2009 | Liu et al. | 341/22 |
| 2009/0121904 | A1 * | 5/2009 | Liu et al. | 341/22 |

* cited by examiner

*Primary Examiner* — Lam T Mai
(74) *Attorney, Agent, or Firm* — WPAT, PC; Justin King

(57) ABSTRACT

A light-emitting keyboard is disclosed, which comprises: a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surfaced and the bottom surface while being sandwiched therebetween; a light source, disposed next to the light entrance surface of the light guide plate; a frame, disposed on the light emitting surface of the light guide plate; a first reflector, disposed on the bottom surface of the light guide plate; and a second reflector, disposed on the side surface of the light guide plate. With the aforesaid structure, light from the light source can be fully utilized so that the overall brightness of the light-emitting keyboard can be enhanced.

8 Claims, 3 Drawing Sheets

LIGHT-EMITTING KEYBOARD

FIELD OF THE INVENTION

The present invention relates to a keyboard, and more particularly, to a light-emitting keyboard.

BACKGROUND OF THE INVENTION

Keyboard, being the most common input interface available on the market, is vastly used in many electric devices, such as computers, person digital assistances, cellular phones, and so on. With the advance of technology, keyboard that can emit light are gradually becoming the mainstream product of keyboard manufacturing industry since it is well adapted to be used in an environment that is not so well illuminated. Such light-emitting keyboards are especially suitable to be applied in notebook computers as the notebook computer, being designed to be carried around and used in all kinds of environments possible, that are equipped with light-emitting keyboards can operate easily under any illumination conditions. In addition, for meeting the growing personalization requirements of today's consumers, light-emitting keyboards can be designed with a hint of amusement for enabling the same to operate with dashing visual effects.

Please refer to FIG. 1, which is a cross sectional view of a conventional light-emitting keyboard. As shown in FIG. 1, the conventional light-emitting keyboard 100 is comprised of: a light guide plate 110, a light emitting diode (LED) 120, a frame 130, and a reflector 140, in which the light guide plate 110 is configured with a light entrance surface 112, a light emitting surface 114, a bottom surface 116 and a side surface 118 whereas the light emitting surface 114 is arranged opposite to the bottom surface 116, and the light entrance surface 112 and the side surface 118 are arranged respectively next and connecting to the light emitting surfaced 114 and the bottom surface 116 while being sandwiched therebetween.

In addition, as the LED 120 is disposed next to the light entrance surface 112 of the light guide plate 110, a beam 122 emitted from the LED 120 will enter the light guide plate 110 through the light entrance surface 112 and then being reflected repetitively inside the light guide plate 110 until a beam 122*a* conforming with the breaking down of total reflection is formed and thus being discharge out of the light guide plate 110 through the light emitting surface 114 and then into the frame 130 for enabling the frame to radiate light. It is noted that the frame 130 is disposed on the light emitting surface 114 of the light guide plate 110.

During the reflection of the beam 122 inside the light guide plate 110, there will be a portion of the reflection, represented as the beam 122*b* in FIG. 1, being discharged out of the light guide plate 110 through the bottom surface 116 thereof. As shown in FIG. 1, the reflector 140 is arranged at a position for enabling the same to reflect the beam 122*b* back to the light guide plate so as to prevent the loss of energy. In this embodiment, the reflector 140 is disposed on the bottom surface 116 of the light guide plate 110. However, during the repetitive reflections, there is still a portion of beam, represented by the beam 122*c*, being discharged out of the light guide plate 110 through the side surface 118 thereof. Thus, there is still a portion of light emitted from the LED 120 being lost which can cause adverse affect to the overall brightness of the light emitting keyboard 100 as well as the lighting efficiency of the same.

SUMMARY OF THE INVENTION

In view of the disadvantages of prior art, the primary object of the present invention is provide a light-emitting keyboard capable of utilizing light from its light source in an efficient manner so that the overall brightness of the light-emitting keyboard is enhanced.

To achieve the above object, the present invention provides a light-emitting keyboard, comprising: a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surfaced and the bottom surface while being sandwiched therebetween; a light source, disposed next to the light entrance surface of the light guide plate; a frame, disposed on the light emitting surface of the light guide plate; a first reflector, disposed on the bottom surface of the light guide plate; a second reflector, disposed on the side surface of the light guide plate.

In an embodiment of the invention, the first reflector is integrally formed with the second reflector, and the first reflector and the second reflector are formed in a manner that they can be bended by a specific angle so as to be engaged with light guide plate 110. In addition, the light source can be a light emitting diode.

In an embodiment of the invention, the light guide plate has a plurality of reflection points disposed on the bottom surface thereof.

In an embodiment of the invention, the light-emitting keyboard further comprises: a shielding layer, disposed at a position between the light-emitting surface of the light guide plate and the frame. It is noted that the shielding layer can be a transparent film having a portion thereof being printed with light-shielding inks.

In an embodiment of the invention, the light guide plate is configured with a via hole, that is formed on the light entrance surface while allowing the light source to be received therein.

To sum up, the light-emitting keyboard of the invention is able to reflect efficiently all the light from its light source back into its light guide plate by the disposing of the second reflector on the side surface of the light guide plate, and thus the overall brightness as well as light efficiency of the light-emitting keyboard are enhanced. As the light-emitting keyboard is able to perform with better light efficiency, it is feasible to reduce the light intensity of its light source or to decrease the amount of light source being configured therein without any sacrifice in brightness so that not only the power consumption of the light-emitting keyboard is reduced, but also the manufacturing cost of the same is decreased.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 2:
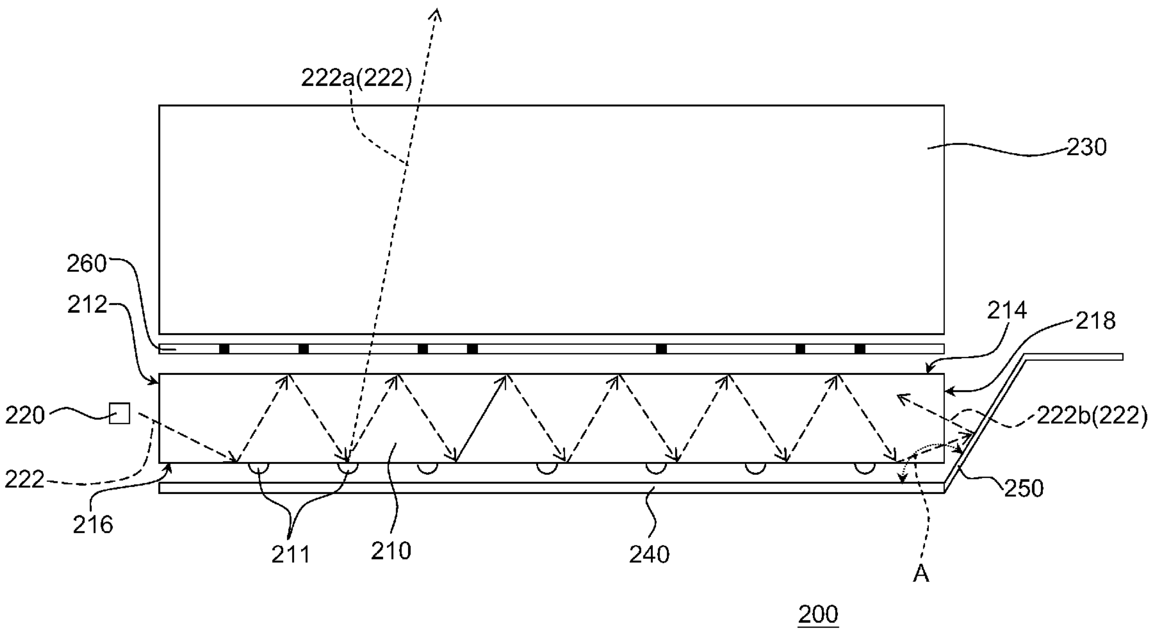
FIG. 2 is a cross sectional view of a light-emitting keyboard according to an embodiment of the invention.

Please refer to FIG. 2, which is a cross sectional view of a light-emitting keyboard according to an embodiment of the invention. In FIG. 2, the light-emitting keyboard 200 comprises: a light guide plate 210, configured with a light entrance surface 212, a light emitting surface 214, a bottom surface 216 and a side surface 218 in a manner that the light emitting surface 214 is arranged opposite to the bottom surface 216, and the light entrance surface 212 and the side surface 218 are arranged respectively next and connecting to the light emitting surfaced 214 and the bottom surface 216 while being sandwiched therebetween; a light source 220, disposed next to the light entrance surface 212 of the light guide plate 210; a frame 230, disposed on the light emitting surface 214 of the light guide plate 210; a first reflector 240, disposed on the bottom surface 216 of the light guide plate 210; and a second reflector 250, disposed on the side surface 218 of the light guide plate 210.

In addition, the light source 220 in this embodiment can be composed of a plurality of LEDs, by the beam 222 emitted therefrom is projected entering into the light guide plate 210 through the light entrance surface 212 thereof. Thereafter, similarly that the beam 222 will be reflected repetitively inside the light guide plate 210 until a beam 222*a* conforming with the breaking down of total reflection is formed and thus being discharge out of the light guide plate 210 through the light emitting surface 214 and then into the frame 230 for enabling the frame 230 to radiate light.

Moreover, for the portion of the beam 222 that is being discharged out of the light guide plate 210 through the bottom surface 216 thereof, it will be reflected back into the light guide plate 210 by the first reflector 240. In addition, for the a portion of beam, represented by the beam 222*b*, that is being discharged out of the light guide plate 110 through the side surface 118, it will be reflected back into the light guide plate 210 by the second reflector 250. Thereby, the energy loss in the light-emitting keyboard comparing with the prior art is reduced.

By the arrangement of the first and the second reflector 240, 250, the beams discharging out of the light guide plate 210 respectively through the bottom surface 216 and the side surface 218 are reflected back into the light guide plate 210, which will be eventually projected out of the same through its light emitting surface 214 so as to be used for enabling the frame 230 to radiate.

Figure 1:
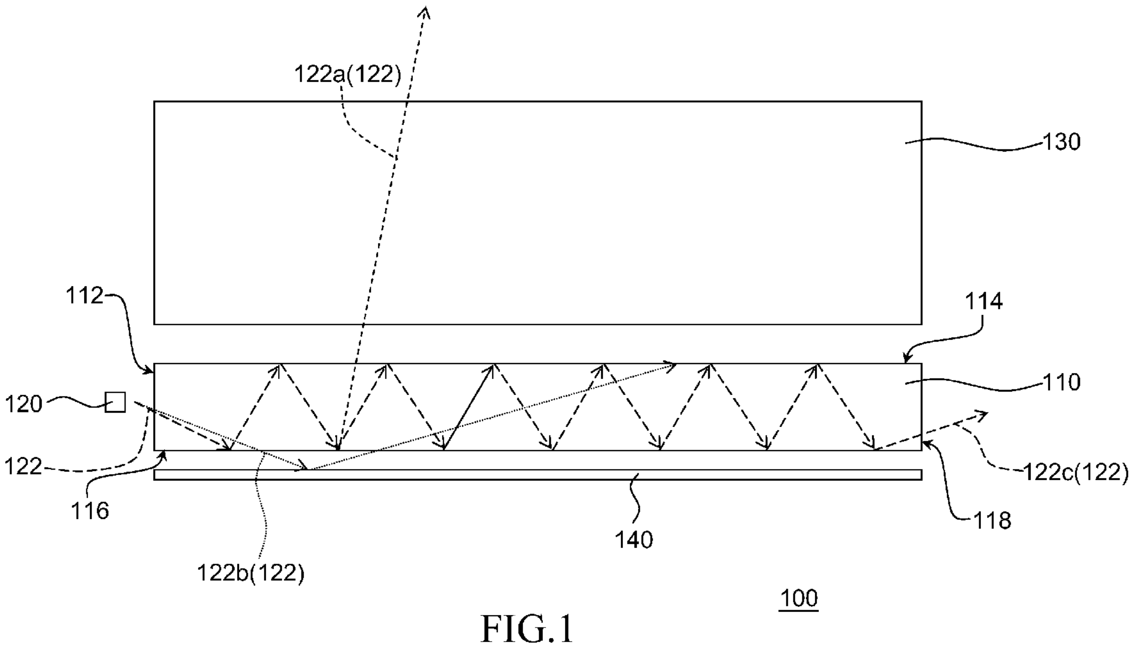
FIG.1 (Prior Art)
FIG. 1 is a cross sectional view of a conventional light-emitting keyboard.

Comparing with the conventional light-emitting keyboard 100 shown in FIG. 1 where there are lights leaking out from its side surface, the light-emitting keyboard 200 of the invention is able to recover all the lights discharged out from its side surface 218 by the arrangement of the second reflector 250 so that not only the overall lighting efficiency can be enhanced, but also the overall brightness of the light-emitting keyboard 200 is increased. Experimentally, under a condition that when a light source of the same intensity is used, the average brightness of the conventional light-emitting keyboard 1000 is about 15.79 nits, but the average brightness of the light-emitting keyboard 200 of the invention can reach 20.87 nits, which is increased by 32%.

Therefor, it is feasible to reduce the light intensity of its light source or to decrease the amount of light source being configured in the light-emitting keyboard 200 without any sacrifice in brightness so that not only the power consumption of the light-emitting keyboard is reduced, but also the manufacturing cost of the same is decreased. Moreover, it is noted that there is no restriction relating to the type of light source 220 capable of being used in the light-emitting keyboard 200 of the invention. That is, instead of LEDs, the light source 220 can be a cold cathode fluorescence lamp (CCFL) or the like.

In this embodiment, the first reflector 240 and the second reflector 250 can be aluminum plate of high reflective index, but are not limited thereby. Moreover, the first reflector 240 can be integrally formed with the second reflector 250, so that not only the process of making the two reflectors can be simplified, but also the labor required for assembling the two reflectors can be decreased as they can be assembled by a single operation.

In addition, the first reflector 240 and the second reflector 250 are formed in a manner that they can be bended by a specific angle A so as to be engaged with light guide plate 210. Thereby, the overall structure integrality and strength of the light-emitting keyboard 200 is enhanced. It is noted that there is no restriction relating to the bending angle A that it is dependent upon the shape and structure of the side surface 218.

As shown in FIG. 2, the light-emitting keyboard 200 further comprises: a shielding layer 260, which is disposed at a position between the light-emitting surface 214 of the light guide plate 210 and the frame 230. In this embodiment, the shielding layer 260 is a transparent film having a portion thereof being printed with light-shielding inks, in which the portion of the light shielding inks including a plurality of areas of the thin film that are located corresponding to the keycap profiles defined on the frame 230, so that the contrasts relating to the keycap profiles can be enhanced for facilitating the same to be identified by users.

Moreover, in order to enable the break down of total reflection relating to the beam 222 for projecting the beam 222*a* out of the light guide plate 210 through the light emitting surface 214 the light guide plate 210 is further being configured with a plurality of reflection points 211 at the bottom surface 216 thereof. However, in another embodiment, the reflection points can be disposed on the side surface 218 which is dependent upon actual requirement.

Operationally, there is a via hole formed on the light guide plate 210 that is provided for guiding the liquid which is accidentally pouring on the light-emitting keyboard 200 to flow out of the same therefrom.

Figure 3:
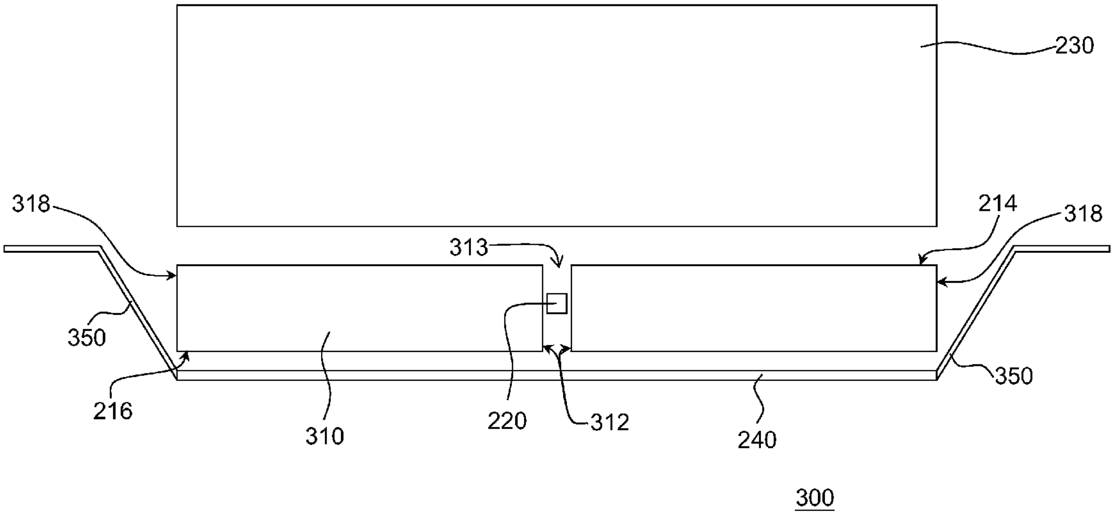
FIG. 3 is a cross sectional view of a light-emitting keyboard according to another embodiment of the invention.

Please refer to FIG. 3, which is a cross sectional view of a light-emitting keyboard according to another embodiment of the invention. As shown in FIG. 3, the difference between the present light-emitting keyboard 300 with the aforesaid light-emitting keyboard 200 is that the light guide plate 310 of the light-emitting keyboard 300 is configured with a via hole 313 in a manner that the via hole 313 is formed on the light entrance surface 312 while allowing the light source 220 to be received therein. Accordingly, the side surface 318 will be the periphery of the light guide plate 310, and thus the second reflector 250 should be formed surrounding the light guide plate 310.

Accordingly, the via hole is provided not only for draining liquid which is accidentally pouring on the light-emitting keyboard 300, but also for receiving the light source 220. As there will be a portion of light that is just being discharged out of the light entrance surface at one side of the light source 220, being projected toward the light entrance surface at another side of the light source 220, or even being projected directly toward the frame 230 above the via hole 313, the overall brightness as well as light efficiency of the light-emitting keyboard are enhanced.

In this embodiment, there is only one via hole 313 being formed that is positioned at the center of the light guide plate 310. However, it is not limited thereby. In another embodiment, there can be four via holes arranged in the light guide plate 310 for enabling the light guide plate 310 to radiate light more evenly as they can be arranged evenly at the corners of the same. As the arrangement of the via hole relating to its amount and position are known to those skilled in the art, it is not described further herein.

To sum up, the light-emitting keyboard has the following advantages:

(1) By the arrangement of the second reflector, more light emitted from the light source can be efficiently reflected back into the light guide plate so that the lighting efficiency as well as the overall brightness of the light-emitting keyboard are greatly enhanced.

(2) It is feasible to reduce the light intensity of its light source or to decrease the amount of light source being configured in the light-emitting keyboard without any sacrifice in brightness so that not only the power consumption of the light-emitting keyboard is reduced, but also the manufacturing cost of the same is decreased.

(3) By arranging the light source inside the via hole, the overall brightness as well as light efficiency of the light-emitting keyboard are enhanced.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A light-emitting keyboard, comprising:

a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surfaced and the bottom surface while being sandwiched therebetween;

a light source, disposed next to the light entrance surface of the light guide plate;

a frame, disposed on the light emitting surface of the light guide plate;

a first reflector, disposed on the bottom surface of the light guide plate; and a second reflector, disposed on the side surface of the light guide plate.

2. The light-emitting keyboard of claim 1, wherein the first reflector is integrally formed with the second reflector.

3. The light-emitting keyboard of claim 2, wherein the first reflector and the second reflector are formed for enabling the two to be bended by a specific angle so as to be engaged with light guide plate.

4. The light-emitting keyboard of claim 1, wherein the light guide plate has a plurality of reflection points disposed on the bottom surface thereof.

5. The light-emitting keyboard of claim 1, further comprising:

a shielding layer, disposed at a position between the light-emitting surface of the light guide plate and the frame.

6. The light-emitting keyboard of claim 5, wherein the shielding layer is a transparent film having a portion thereof being printed with light-shielding inks.

7. The light-emitting keyboard of claim 1, wherein the light guide plate is configured with a via hole in a manner that the via hole is formed on the light entrance surface while allowing the light source to be received therein.

8. The light-emitting keyboard of claim 1, wherein the light source is a light emitting diode.

* * * * *

US008253598C1

(12) EX PARTE REEXAMINATION CERTIFICATE (9938th)

United States Patent

Ho

(10) Number: US 8,253,598 C1

(45) Certificate Issued: Nov. 13, 2013

(54) LIGHT-EMITTING KEYBOARD

(75) Inventor: Shin-Cheng Ho, Taipei County (TW)

(73) Assignee: Darfon Electronics Corp., Gueishan, Taoyuan (TW)

Reexamination Request:
No. 90/012,718, Nov. 9, 2012

Reexamination Certificate for:
Patent No.: 8,253,598
Issued: Aug. 28, 2012
Appl. No.: 12/651,743
Filed: Jan. 4, 2010

(30) Foreign Application Priority Data

Jan. 9, 2009 (TW) ............................... 98200315 U

(51) Int. Cl.
*H03K 17/94* (2006.01)

(52) U.S. Cl.
USPC ............ 341/22; 200/310; 200/314; 345/168; 345/170; 349/149; 349/150; 349/58; 349/61; 362/253; 362/617; 362/623; 362/634; 400/472; 400/489

(58) Field of Classification Search
None
See application file for complete search history.

(56) References Cited

To view the complete listing of prior art documents cited during the proceeding for Reexamination Control Number 90/012,718, please refer to the USPTO's public Patent Application Information Retrieval (PAIR) system under the Display References tab.

*Primary Examiner* — Deandra Hughes

(57) ABSTRACT

A light-emitting keyboard is disclosed, which comprises: a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surfaced and the bottom surface while being sandwiched therebetween; a light source, disposed next to the light entrance surface of the light guide plate; a frame, disposed on the light emitting surface of the light guide plate; a first reflector, disposed on the bottom surface of the light guide plate; and a second reflector, disposed on the side surface of the light guide plate. With the aforesaid structure, light from the light source can be fully utilized so that the overall brightness of the light-emitting keyboard can be enhanced.

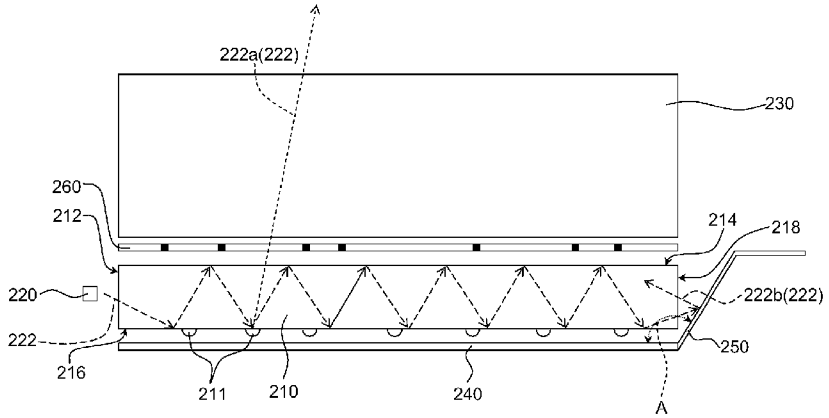

200

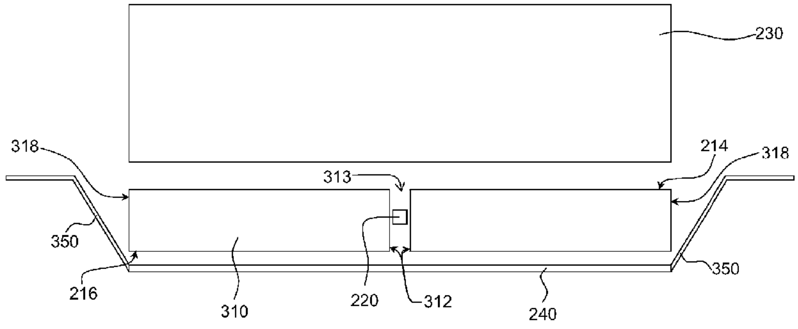

300

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2-6 and 8 are cancelled.

Claims 1 and 7 are determined to be patentable as amended.

New claims 9-34 are added and determined to be patentable.

1. A light-emitting keyboard, comprising:

a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting [surfaced] *surface* and the bottom surface while being sandwiched therebetween;

a light source, disposed next to the light entrance surface of the light guide plate;

a frame *comprising keycap profiles defined on the frame, the frame being* disposed on the light emitting surface of the light guide plate;

a first reflector, disposed on the bottom surface of the light guide plate; and a second reflector, disposed on the side surface of the light guide plate.

7. A light-emitting keyboard [of claim 1], *comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,* wherein the light guide plate is configured with a via hole in a manner that the via hole is formed on the light entrance surface while allowing the light source to be received therein.

*9. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,*

*wherein the first reflector and the second reflector are formed at an angle greater than 90 degree.*

*10. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,*

*wherein the second reflector being adjacent to the side surface, with spacing between them.*

*11. The light-emitting keyboard of claim 10, wherein the spacing between the second reflector and the side surface at one end of the second reflector is larger than the spacing at the other end of the second reflector.*

*12. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate;*

*a second reflector, disposed on the side surface of the light guide plate; and*

*a segment connected to the second reflector at one end of the second reflector.*

*13. The light-emitting keyboard of claim 12, wherein the segment is parallel to the first reflector.*

*14. The light-emitting keyboard of claim 12, wherein the segment is at a level higher than the light emitting surface.*

*15. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged*

*respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,*

*wherein the bottom surface of the light guide plate is substantially flat, and a plurality of reflection points protruding from the bottom surface thereof.*

*16. The light-emitting keyboard of claim 1, wherein the bottom surface of the light guide plate and the light emitting surface of the light guide plate are configured to share the same surface profile.*

*17. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,*

*wherein the frame has a bottom edge that spans entire length of the light emitting surface of the light guide plate.*

*18. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,*

*wherein the light guide plate is configured with a hole having the light source received therein.*

*19. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,*

*wherein the bottom surface of the light guide plate and the light emitting surface of the light guide plate are configured to share the same surface profile.*

*20. A light-emitting keyboard, comprising:*

*a light guide plate, configured with a light entrance surface, a light emitting surface, a bottom surface and a side surface in a manner that the light emitting surface is arranged opposite to the bottom surface, and the light entrance surface and the side surface are arranged respectively next and connecting to the light emitting surface and the bottom surface while being sandwiched therebetween;*

*a light source, disposed next to the light entrance surface of the light guide plate;*

*a frame, disposed on the light emitting surface of the light guide plate;*

*a first reflector, disposed on the bottom surface of the light guide plate; and*

*a second reflector, disposed on the side surface of the light guide plate,*

*wherein the bottom surface of the light guide plate is substantially flat, and a plurality of reflection points are disposed on the bottom surface of the light guide plate.*

*21. The light-emitting keyboard of claim 7, wherein the light guide plate has a plurality of reflection points disposed on the bottom surface thereof.*

*22. The light-emitting keyboard of claim 7, further comprising: a shielding layer, disposed at a position between the light-emitting surface of the light guide plate and the frame.*

*23. The light-emitting keyboard of claim 7, wherein the second reflector being adjacent to the side surface, with spacing between them.*

*24. The light-emitting keyboard of claim 23, wherein the spacing between the second reflector and the side surface at one end of the second reflector is larger than the spacing at the other end of the second reflector.*

*25. The light-emitting keyboard of claim 7, comprising a segment connected to the second reflector at one end of the second reflector.*

*26. The light-emitting keyboard of claim 25, wherein the segment is parallel to the first reflector.*

*27. The light-emitting keyboard of claim 25, wherein the segment is at a level higher than the light emitting surface.*

*28. The light-emitting keyboard of claim 7, wherein the light guide plate has a plurality of reflection points protruding from the bottom surface thereof.*

*29. The light-emitting keyboard of claim 1, wherein the first reflector is integrally formed with the second reflector.*

*30. The light-emitting keyboard of claim 29, wherein the first reflector and the second reflector are formed for enabling the two to be bended by a specific angle so as to be engaged with light guide plate.*

*31. The light-emitting keyboard of claim 1, wherein the light guide plate has a plurality of reflection points disposed on the bottom surface thereof.*

*32. The light-emitting keyboard of claim 1, further comprising: a shielding layer, disposed at a position between the light-emitting surface of the light guide plate and the frame.*

*33. The light-emitting keyboard of claim 32, wherein the shielding layer is a transparent film having a portion thereof being printed with light-shielding inks.*

*34. The light-emitting keyboard of claim 1, wherein the light source is a light emitting diode.*

* * * * *